US012772475B2

(12) United States Patent
Mauriac et al.

(10) Patent No.: US 12,772,475 B2
(45) Date of Patent: Oct. 20, 2026

(54) TRIAC GATE DESIGN FOR COMMUTATION SENSITIVITY TRADE OFF IMPROVEMENT

(71) Applicant: STMicroelectronics International N.V., Geneva (CH)

(72) Inventors: Christophe Mauriac, Montbazon (FR); Laurent Siegert, La Menbrolle sur Choisille (FR)

(73) Assignee: STMicroelectronics International N.V., Geneva (CH)

( * ) Notice: Subject to any disclaimer, the term of this patent is extended or adjusted under 35 U.S.C. 154(b) by 571 days.

(21) Appl. No.: 18/204,009

(22) Filed: May 31, 2023

(65) Prior Publication Data

US 2024/0405111 A1 Dec. 5, 2024

(51) Int. Cl.
*H10D 18/80* (2025.01)

(52) U.S. Cl.
CPC .................................. *H10D 18/80* (2025.01)

(58) Field of Classification Search
None
See application file for complete search history.

(56) References Cited

U.S. PATENT DOCUMENTS

| | | | | |
|---|---|---|---|---|
| 4,641,175 A * | 2/1987 | Shiraishi | H10D 18/80 257/163 |
| 4,994,885 A * | 2/1991 | Yoshizawa | H10D 18/80 257/163 |
| 5,747,836 A | 5/1998 | Mariyama | |
| 9,680,468 B2 | 6/2017 | Hague et al. | |

(Continued)

FOREIGN PATENT DOCUMENTS

| | | |
|---|---|---|
| CN | 101587895 A | 11/2009 |
| CN | 108063164 A | 5/2018 |

(Continued)

OTHER PUBLICATIONS

Toshiba, "Triac Couplers—Basic Properties and Application Design," Application Notes, Toshiba Electronic Devices & Storage Corporation, Jun. 7, 2021, 36 pgs.

(Continued)

*Primary Examiner* — Khaja Ahmad

(74) *Attorney, Agent, or Firm* — Crowe & Dunlevy LLC

(57) ABSTRACT

A TRIAC features first and second main-terminal contacts, and a gate terminal contact, with multiple semiconductor regions stacked along a first-axis and extending laterally along an intersecting second-axis that defines first, second, and middle regions. The semiconductor regions include a third N-type region overlying the second main-terminal contact, a second P-type region overlying the second main-terminal contact, a second N-type region overlying the second P-type region, a first P-type region overlying the second N-type region, a first N-type region partially overlying the first P-type region, a fourth N-type region partially overlying the first P-type region, and a fifth N-type region partially overlying the first P-type region. The first main-terminal contact is partly on the first N-type region in the first region and on the first P-type region in the second region, while the gate terminal contact is partly on both the first P-type region and the fourth N-type region.

12 Claims, 6 Drawing Sheets

(56) References Cited

U.S. PATENT DOCUMENTS

| | | | | |
|---|---|---|---|---|
| 10,069,001 | B2 | 9/2018 | Menard | |
| 2003/0001169 | A1* | 1/2003 | Simonnet | H10D 18/80 257/146 |
| 2005/0017263 | A1* | 1/2005 | Simmonet | H10D 84/131 257/119 |
| 2005/0133815 | A1* | 6/2005 | Menard | H10D 18/221 257/132 |
| 2006/0027832 | A1 | 2/2006 | Mariyama et al. | |
| 2012/0146089 | A1* | 6/2012 | Menard | H10D 18/80 257/119 |
| 2013/0049065 | A1* | 2/2013 | Menard | H10D 18/80 257/E29.215 |
| 2014/0175507 | A1* | 6/2014 | Moroda | H10D 18/80 257/120 |
| 2015/0084094 | A1 | 3/2015 | Menard | |

FOREIGN PATENT DOCUMENTS

| | | | |
|---|---|---|---|
| JP | S5721862 | A | 2/1982 |
| JP | 3241544 | B2 | 10/2001 |
| JP | 2009245987 | A | 10/2009 |
| KR | 20000032819 | A | 6/2000 |
| WO | 03056631 | A1 | 7/2003 |

OTHER PUBLICATIONS

Onsemi, "RC Snubber Networks for Thyristor Power Control and Transient Suppression," Jun. 2008, 23 pgs.

EP Search Report and Written Opinion for counterpart, EP Appl. No. 24315249.3, report dated Oct. 17, 2024, 13 pgs.

* cited by examiner

TRIAC GATE DESIGN FOR COMMUTATION SENSITIVITY TRADE OFF IMPROVEMENT

TECHNICAL FIELD

This disclosure is directed to the field of TRIACs and, in particular, to a gate design for a TRIAC that improves the ratio commutation sensitivity.

BACKGROUND

A TRIAC (Triode for Alternating Current), a schematic for which is shown in FIG. 1, is a three-terminal semiconductor device that acts as a bidirectional switch. It can conduct and control current flow in either direction between its first main terminal (MT1) and its second main terminal (MT2) when a triggering signal is applied to its gate terminal (G).

The TRIAC is effectively formed by two thyristors, Th1 and Th2, connected in parallel but with opposing polarities. It is designed to provide full-wave control over an AC circuit. The TRIAC can be triggered into conduction by applying a small positive or negative current at its gate terminal (G) relative to its first main terminal (MT1). Once triggered, the TRIAC continues to conduct until the current flowing through it drops below the TRIAC's holding current level, or when the AC waveform approaches zero (near the zero-crossing point).

The performance of a TRIAC is influenced by its sensitivity and commutation characteristics. Sensitivity refers to the level of gate current required to trigger the TRIAC into conduction. In contrast, commutation refers to the TRIAC's ability to transition from a conducting to a non-conducting state when the current passing through it drops below the holding current and a voltage reapplied in the opposite polarity. The commutation also concerns the maximum rate of decrease of the load current permitted to turn the TRIAC off; if the load current decreases too rapidly, the TRIAC may fail to turn off and remain on into the next polarity.

In a TRIAC, there is a tradeoff between commutation and sensitivity due to the inherent properties of the semiconductor material used in its construction. Enhanced commutation capabilities, which allow for quicker transitioning between conducting and non-conducting states, may be achieved through a decrease in free carrier lifetime or by design. However, these solutions often come at the expense of reduced sensitivity.

As the voltage rating of a TRIAC increases, the device is subjected to higher voltage stress, necessitating an increase in the thickness of the semiconductor material to withstand these higher voltages. This increased thickness results in a decreased free carrier lifetime and an increased storage area, which could lead to reduced sensitivity, slower turn-off times, and inadequate commutation performance. To counteract this effect, design changes are necessary to increase sensitivity and maintain proper commutation in the thicker semiconductor material.

However, the design changes typically needed for proper commutation can further reduce the sensitivity of the TRIAC, making it even more challenging to control with low gate currents. This tradeoff between commutation and sensitivity, exacerbated by the increased thickness utilized for higher voltage handling, is a limitation in conventional TRIAC design and operation, particularly for high voltage applications.

Given this, further development is needed.

SUMMARY

Disclosed herein is a TRIAC, including first and second main terminal contacts, and a gate terminal contact. The TRIAC further includes a plurality of semiconductor regions stacked along a first axis and extending laterally along an intersecting second axis, defining first, second, and middle regions.

The plurality of semiconductor regions includes the following regions. A third N-type region overlies the second main terminal contact, extending laterally through the second region and partially through the middle region. A second P-type region overlies the second main terminal contact, extending laterally through the first region, partially over the third N-type region in the middle region, and over the third N-type region in the second region. A second N-type region overlies the second P-type region, extending laterally across the first region, middle region, and second region. A first P-type region overlies the second N-type region, extending laterally across the first region, middle region, and second region. A first N-type region partially overlies the first P-type region, extending laterally partly through the first region. A fourth N-type region partially overlies the first P-type region, extending laterally partly through the middle region. A fifth N-type region partially overlies the first P-type region, extending laterally partly through the first region and the middle region.

A portion of the first main terminal contact is disposed on the first N-type region in the first region and another portion is disposed on the first P-type region in the second region. The gate terminal contact is disposed partially on the first P-type region and the fourth N-type region in the middle region.

A first thyristor is formed in the first region and a second thyristor is formed in the second region. The first thyristor is formed by the first N-type region, the first P-type region, the second N-type region and the second P-type region. The second thyristor is formed by the third N-type region, the second P-type region, the second N-type region, and the first P-type region. The gate terminal contact is connected to the first P-type region and the fourth N-type region to control current flow between the first and second main terminal contacts by modulating operation of the first and second thyristors within the TRIAC. The fifth N-type region is positioned between the first N-type region and the fourth N-type region, serving as a serial resistance between the gate terminal contact and the first main terminal contact, improving sensitivity and commutation of the TRIAC in certain operating conditions without causing significant degradation of sensitivity of the TRIAC in other operating conditions.

The first and second thyristors are configured to operate in first, second, third, and fourth quadrants based on polarity of a voltage applied across the first and second main terminals and the polarity of a current applied between the gate terminal and the first main terminal. Presence of the fifth N-type region lowers a gate trigger current in the second and the third quadrant of operation and increases a critical rate of rise of off-state current of the TRIAC when the TRIAC is operating with a negative power current, through Th2, resulting in increased sensitivity and improved commutation when the TRIAC is operating in the I−V+ region.

The first, third, fourth and fifth N-type regions are heavily doped. The first and second P-type regions are moderately doped. The second N-type region is lightly doped.

Also disclosed herein is a TRIAC, including a first main terminal contact, a second main terminal contact, and a gate terminal contact. The TRIAC also includes a first thyristor comprising a PNP transistor and a NPN transistor, with the base of the NPN transistor being connected to the collector of the PNP transistor and the base of the PNP transistor is connected to the collector of the NPN transistor. The emitter-base junction of the NPN transistor has a forward-biased behavior modeled by a diode and a pinch-off resistance in parallel. As with the first thyristor, the second thyristor is formed by a PNP transistor and a NPN transistor, with the base of the NPN transistor being connected to the collector of the PNP transistor and the base of the PNP transistor is connected to the collector of the NPN transistor. In both cases, a shared semiconductor region forms the collector of the NPN transistor and the base of the PNP transistor. The gate terminal contact is connected to the base of the NPN transistor which is involved in the first thyristor, allowing control of current flow between the first and second main terminal contacts by modulating operation of the NPN and PNP transistors. A serial resistance is formed between the gate terminal contact and the first main terminal contact, thereby improving sensitivity and commutation of the TRIAC in certain operating conditions without causing significant degradation of sensitivity in other operating conditions.

The first thyristor is formed in a first semiconductor region, the second thyristor is formed in a second semiconductor region, and the shared semiconductor region is formed in a third semiconductor region that is located between the first and second semiconductor regions.

The first thyristor is a two-lead thyristor, the second thyristor is a two-lead thyristor, and the shared semiconductor region is a common base region of the first and second thyristors.

The TRIAC may be utilized in a system for controlling AC power. The system may include the TRIAC having its first main terminal contact connected to an AC power source and its second main terminal contact connected to a load, with a control circuit being coupled to the gate terminal contact of the TRIAC. The control circuit is configured to modulate operation of the TRIAC and control power delivery from the AC power source to the load based on a set of operating conditions of the load. The load may be at least one of a motor, a motor starter, a solid state relay, an AC Switch Transistor device, or a lighting system.

Also disclosed herein is a TRIAC, including a first layer doped with a first conductivity type, a first region doped with a second conductivity type at a surface of the first layer, with the first region forming a cathode of a first thyristor of the TRIAC and the first layer forming a gate of the first thyristor. A cathode metal layer is in contact with the first region. A second region is doped with the second conductivity type at the surface of the first layer. A gate metal layer is in contact with the second region and in contact with the surface of the first layer. A third region is doped with the second conductivity type and extending from the second region in a position between the first region and where the gate metal layer contacts the surface of the first layer.

The first, the second and the third regions with the second conductivity type are heavily doped. The first layer with the first conductivity type is moderately doped.

Also disclosed herein is a TRIAC, including a semiconductor substrate, a second P-type region formed in the semiconductor substrate, and a third N-type region formed in the semiconductor substrate, adjacent to the second P-type region. The TRIAC also includes a second N-type region formed in the semiconductor substrate on the second P-type region, a first P-type region formed in the semiconductor substrate on the second N-type region, a first N-type region formed in the semiconductor substrate, adjacent to the first P-type region, and a fourth N-type region formed in the semiconductor substrate, adjacent to the first P-type region at a same level as the first N-type region and spaced apart therefrom. A fifth N-type region is formed in the semiconductor substrate, adjacent to the first P-type region at a same level as the first and fourth N-type regions and positioned therebetween but spaced apart therefrom. A first main terminal contact has a first portion disposed on the first N-type region and a second portion disposed on the first P-type region. A second main terminal contact is disposed on the second P-type region and the third N-type region. A gate terminal contact is disposed partially on the first P-type region and partially on the fourth N-type region.

The first, third, fourth and fifth N-type regions are heavily doped. The first and second P-type regions are moderately doped. The second N-type region is lightly doped.

The fifth N-type region is formed as a finger extending from the fourth N-type region.

Also disclosed herein is a method of making an improved TRIAC device, the method including forming a TRIAC device. The formation of the TRIAC device is performed by doping a first layer with a first conductivity type, with the doping of the first layer having a greater concentration toward an upper portion thereof than toward a lower portion thereof. The formation of the TRIAC device further includes doping a first region with a second conductivity type at a surface of the first layer so that the first region forms a cathode of a first thyristor of the TRIAC and the first layer forms a gate of the first thyristor. The formation of the TRIAC device additional includes forming a cathode metal layer in contact with the first region, doping a second region with the second conductivity type at the surface of the first layer, and forming a gate metal layer in contact with the second region and in contact with the surface of the first layer. The method includes improving sensitivity and commutation of the TRIAC in certain operating conditions without causing significant degradation of sensitivity in other operating conditions by increasing resistance along a current path between the gate metal layer and the cathode metal layer by forcing the current to traverse through the lower portion of the first layer.

The current may be forced to traverse through the lower portion of the first layer as it traverses along the current path between the gate metal layer and the cathode metal layer by doping a third region with the second conductivity type so that the third region extends from the second region in a position between the first region and where the gate metal layer contacts the surface of the first layer.

A doping level of the third region with the second conductivity type may optionally be greater than a doping level of the second region with the second conductivity type.

The first region may be moderately doped, the upper portion of the first layer may be moderately doped, and the second region may be heavily doped, with the third region being heavily doped.

DETAILED DESCRIPTION

The following disclosure enables a person skilled in the art to make and use the subject matter described herein. The general principles outlined in this disclosure can be applied to embodiments and applications other than those detailed above without departing from the spirit and scope of this disclosure. It is not intended to limit this disclosure to the embodiments shown, but to accord it the widest scope consistent with the principles and features disclosed or suggested herein.

In this disclosure, various semiconductor regions will be described as being "lightly doped", "moderately doped", or "heavily doped". Sample doping concentrations for the lightly doped regions may be $1\times10^{14}$ to $1\times10^{17}$ atoms/cm$^3$. Sample doping concentrations for the moderately doped regions may be $1\times10^{17}$ to $5\times10^{18}$ atoms/cm$^3$. Sample doping concentrations for the heavily doped regions may be $5\times10^{18}$ to $1\times10^{21}$ atoms/cm$^3$. Other doping concentrations may be used, however.

Figure 1:
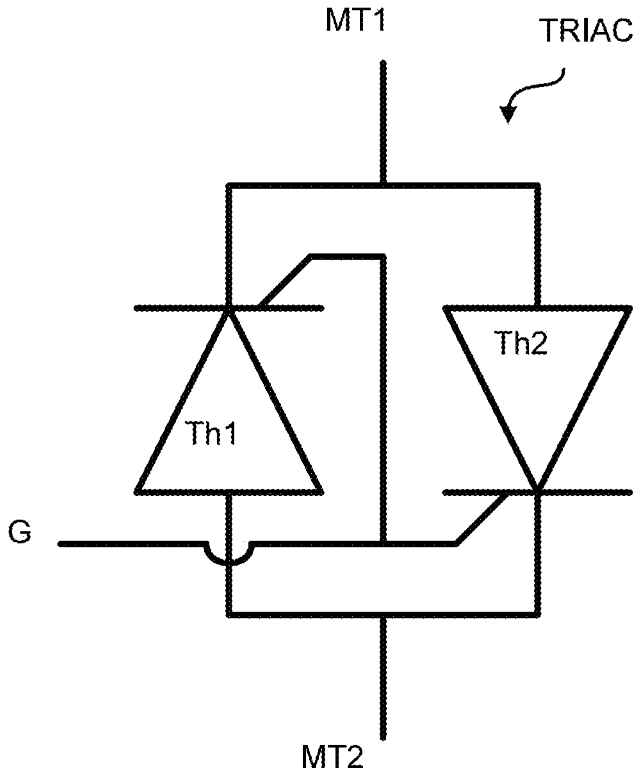
FIG. 1 is a schematic diagram of a TRIAC.
Figure 2A:
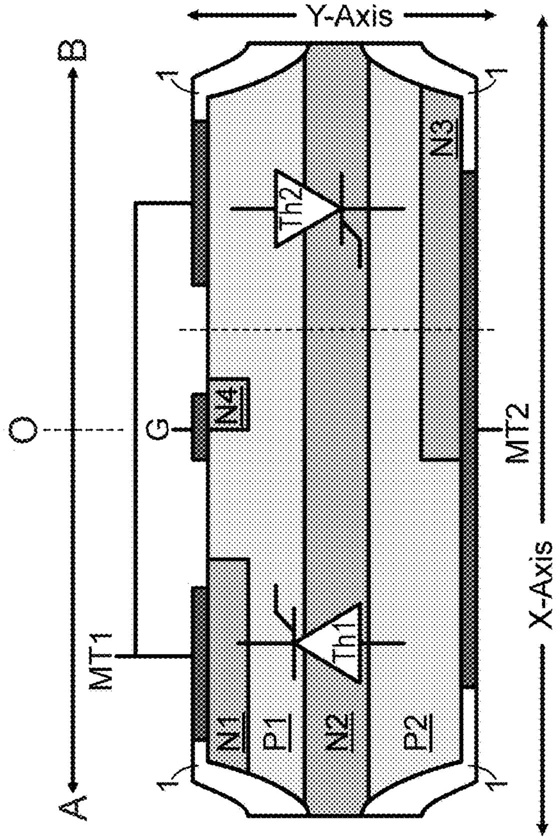
FIG. 2A is a cross-sectional view of a TRIAC design of FIG. 1.
Figure 2B:
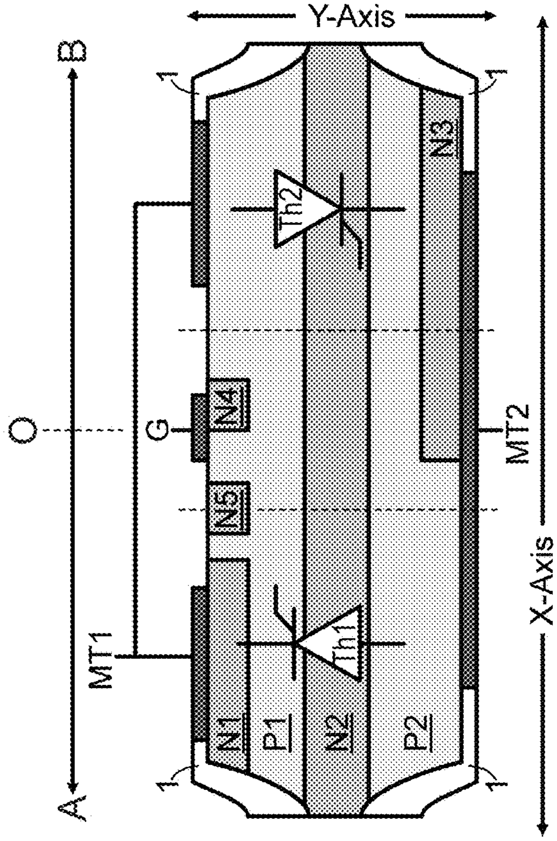
FIG. 2B is a cross-sectional view of a TRIAC design disclosed herein.

This disclosure is understood best by comparing the TRIAC design herein to a conventional TRIAC design. Shown in FIG. 2A is a cross-sectional view of a conventional TRIAC formed in double mesa technology while shown in FIG. 2B is a cross-sectional view of the TRIAC disclosed herein, also formed in double mesa technology.

First, the various common regions of the designs of FIGS. 2A and 2B will be described, and thereafter, the differences will be discussed. Therefore, refer to the cross-sectional views of FIGS. 2A and 2B, in which it can be seen that the TRIAC is formed of various doped regions of a semiconductor substrate stacked between first and second main terminals. The device is constructed using a double mesa technology process, which involves the creation of two separate flat-topped structures, or mesas, within the n-type region N2 of the semiconductor substrate. Passivation glass layers 1 are formed over the mesa sidewalls. The various doped regions in the substrate are created by adding specific impurities to achieve different charge carrier concentrations. The cross-section of a TRIAC is divided into the left side (Thyristor 1, referred to as Th1), middle (gate region), and right side (Thyristor 2, referred to as Th2). Th1 has its anode at the bottom and its cathode at the top, while Th2 has its cathode at the bottom and its anode at the top.

From bottom up, the TRIAC begins with a metal layer forming the MT2 contact, which serves as the main terminal 2 (MT2) or anode 2 (A2) and is a common terminal for both thyristors within the TRIAC. On top of this, on the right side and part of the center, is the N3 region—an N-type region of the semiconductor substrate heavily doped with donor impurities—forming the cathode region of Th2. The P2 region, a P-type region of the semiconductor substrate moderately doped with acceptor impurities, lies on top of the MT2 contact on the left side and part of the center, and extends over the N3 region in the other part of the center and the right side. The N2 region, another N-type region of the semiconductor substrate lightly doped with donor impurities, is on the P2 region and extends fully across from left to right. The P1 region, a P-type region of the semiconductor substrate moderately doped with acceptor impurities, also extends fully across from left to right. An N1 region, an N-type region of the semiconductor substrate heavily doped with donor impurities, is at the top of the left side of the P1 region. An N4 region, an N-type region of the semiconductor heavily doped with donor impurities, is at the top of the middle of the P1 region. At the very top of the TRIAC is a metal layer forming the MT1 contact.

Figure 3:
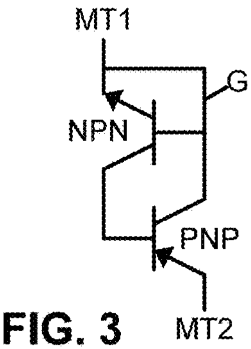
FIG. 3 is an equivalent BJT model for an SCR (thyristor Th1 or thyristor Th2) design of FIG. 1.

In the Bipolar Junction Transistor (BJT) model of a Silicon Controlled Rectifier (SCR), shown in FIG. 3, the base of the NPN transistor is connected to the collector of the PNP transistor, and the base of the PNP transistor is connected to the collector of the NPN transistor. The emitter of each transistor is connected to one of the two main terminals of the SCR. To trigger the SCR into conduction, a positive current is to be injected between the gate (G) and one main terminal (MT1). This positive gate current, through the direct polarization of the base-emitter junction of the NPN transistor, leads to the activation of the device.

A TRIAC can be conceptualized as two SCRs (or thyristors Th1 and Th2) connected in parallel but with opposite polarities. This configuration allows the TRIAC to conduct in both directions. However, the gate of Th2 is not directly accessible, so its control is based on the capability to inject carriers from the gate into the main conduction region through PN junctions.

Figure 4A:
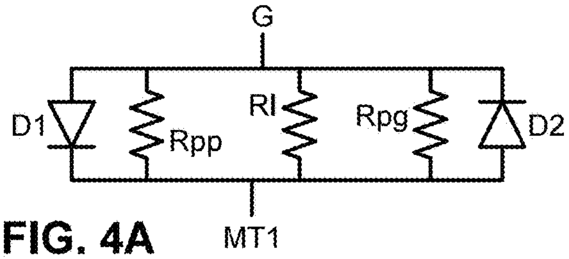
FIG. 4A is an equivalent parallel diode/resistor circuit of the gate to first main terminal path in the TRIAC design of FIG. 2A.

The equivalent circuit model shown in FIG. 4A illustrates the gate-to-MT1 characteristics of the prior art TRIAC of FIG. 2A. This model features two PN junctions, D1 and D2, which are involved in triggering quadrants Q1 & Q4 and Q2 & Q3, respectively.

Resistor Rpp represents the power pinched resistance, which is the resistance associated with the controlled flow of current through the base-emitter junction of the NPN transistor. Resistor Rl represents the leak resistance, associated with the small amount of leakage current that does not flow through the base-emitter junction when the TRIAC is off. These resistors, Rpp and Rl, are connected in parallel with diode D1. These resistances are analogous to the off-state resistances between the base and the emitter of the NPN transistor.

Diode D1 exemplifies the forward-biased behavior of the base-emitter junction of the NPN transistor. The anode of diode D1 is connected to the gate terminal G and its cathode is connected to MT1.

Additionally, a parallel combination of resistor Rpg and diode D2 is connected in series between the gate terminal G and MT1. Resistor Rpg represents the gate pinched resistance, which is related to the resistance encountered when the TRIAC is triggered by a negative gate signal, influencing the current flow through the base-emitter junction of the NPN transistor.

Figure 4B:
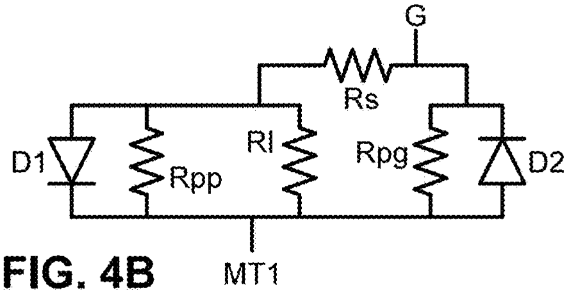
FIG. 4B is an equivalent parallel diode/resistor circuit of the gate to first main terminal path in the TRIAC design of FIG. 2B.

The equivalent circuit model shown in FIG. 4B illustrates the gate-to-MT1 characteristics of the TRIAC of FIG. 2B. This model features two PN junctions, D1 and D2, which are involved in triggering quadrants Q1 & Q4 and Q2 & Q3, respectively.

In this model, a resistor Rs, representing the resistance associated with the N5 region, is connected in series between the gate terminal G and a parallel combination of resistors Rpp, Rl, and diode D1. This resistance, Rs, associated with the N5 region, corresponds to the base-emitter path of the NPN transistor in the off-state of the TRIAC. The N5 region affects the sensitivity of the gate signal, and its resistance directly influences the performance characteristics of the TRIAC.

Resistor Rpp represents the power pinched resistance, which is the resistance associated with the controlled flow of current through the base-emitter junction of the NPN transistor. Resistor Rl represents the leak resistance, associated with the small amount of leakage current that does not flow through the base-emitter junction when the TRIAC is off. These resistors, Rpp and Rl, are connected in parallel with diode D1 between resistor Rs (the N5 region) and MT1. These resistances are analogous to the off-state resistances between the base and the emitter of the NPN transistor.

Diode D1 exemplifies the forward-biased behavior of the base-emitter junction of the NPN transistor. The anode of diode D1 is connected to the resistor Rs (N5 region), and its cathode is connected to MT1.

Additionally, a parallel combination of resistor Rpg and diode D2 is connected in series between the gate terminal G and MT1. Resistor Rpg represents the gate pinched resistance, which is related to the resistance encountered when the TRIAC is triggered by a negative gate signal, influencing the current flow through the base-emitter junction of the NPN transistor.

Figure 2C:
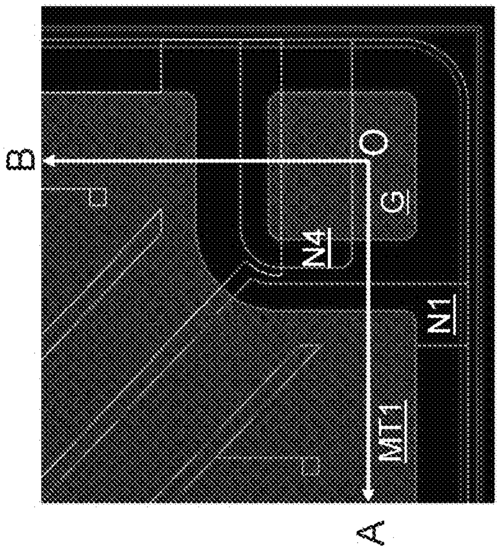
FIG. 2C is a close-up view of the layout of the gate and surrounding areas of the TRIAC design of FIG. 2A.

A close up view of the layout of the prior art TRIAC of FIG. 2A is shown in FIG. 2C. To appreciate FIGS. 2A and 2C, notice that FIG. 2A is a cross sectional view along the line A-B (with the origin point O being shown) while FIG. 2C is an overhead view of the prior art TRIAC, with the line O-A being the X-Axis in FIG. 2C while the line O-B is the Y-Axis in FIG. 2C. Observe in particular the N1 and N4 regions. Another close view of the layout of the prior art TRIAC of FIG. 2A may be found in FIG. 2E, here showing the various resistances described above with respect to FIGS. 3 and 4A.

Figure 2D:
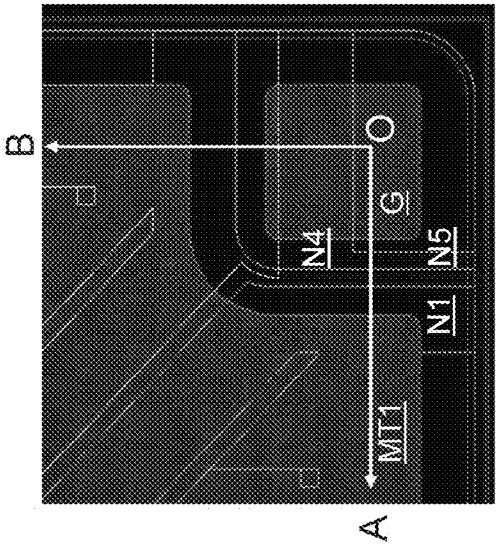
FIG. 2D is a close-up view of the layout of the gate and surrounding areas of the TRIAC design of FIG. 2B.
Figure 2E:
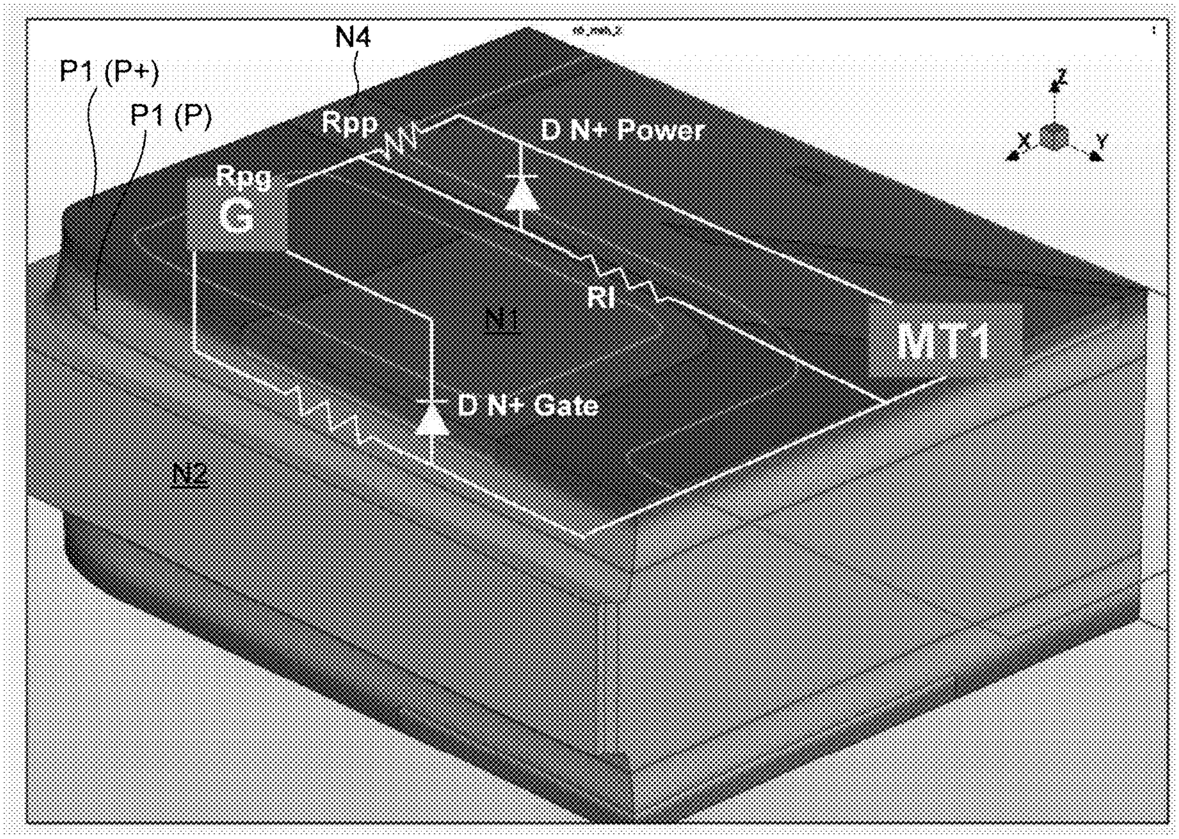
FIG. 2E is a perspective view of the layout of the gate and surrounding areas of the TRIAC design of FIG. 2A.
Figure 2F:
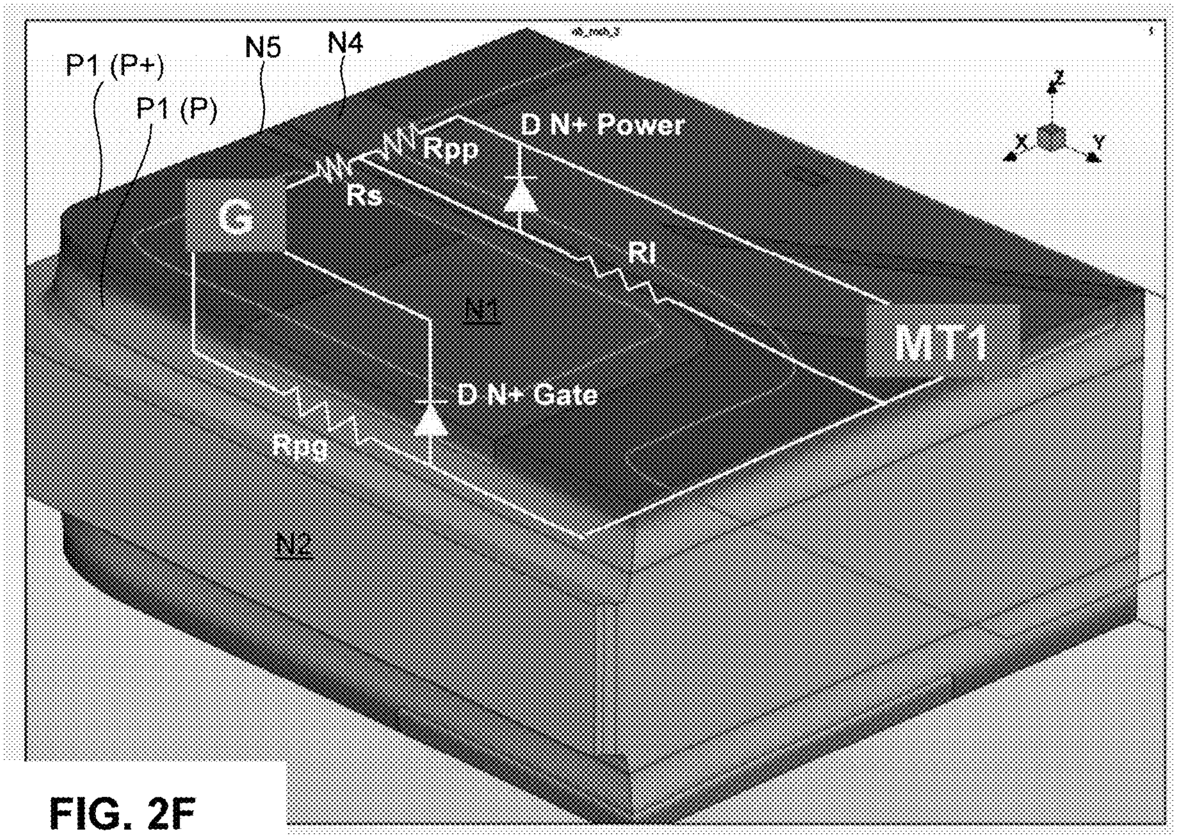
FIG. 2F is a perspective view of the layout of the gate and surrounding areas of the TRIAC design of FIG. 2B.

In contrast to the conventional layout of the TRIAC shown in FIG. 2B, FIG. 2D provides a close up view of the layout of the TRIAC design of FIG. 2B. Observe that FIG. 2B is a cross-sectional view along the line A-B (with the origin point O denoted), while FIG. 2D represents an overhead view of the TRIAC, with the line O-A forming the X-Axis and the O-B line the Y-Axis. Another close view of the layout of the prior art TRIAC of FIG. 2B may be found in FIG. 2F, here showing the various resistances described above with respect to FIG. 4B.

Take particular note of the N1 and N4 regions, and, in particular, the newly introduced N5 region. Note that the N4 and N5 regions make up a single continuous area, with N5 acting as an extension, or finger, from N4. This configuration forms a resistive current path, accounting for the resistance Rs.

Stated another way, in the TRIAC of FIG. 2B an N+ strip—the N5 region—has been added, altering the current path. Instead of the current flowing along the surface of P1 as in the conventional design of FIG. 2A, the addition of the N5 region forces the current to traverse beneath the N5 strip through a region with lower P doping (e.g., the upper portion of P1 is more highly doped than the lower portion of P1). This alteration increases the resistance, effectively closing the direct path between the gate and the MT1 electrodes. The value of resistance Rs is thus compounded by the leak resistance RI (resulting in Rs+Rl), providing for greater control over the sensitivity and performance characteristics of the TRIAC of FIG. 2B. Indeed, it has been found that the placement of this N+ region N5 advantageously improves the sensitivity of the TRIAC in certain operating conditions and improves the commutation of the TRIAC in certain operating conditions, without causing a degradation of consequence to sensitivity in other operating conditions. This will now be explained in detail.

A TRIAC has four different operating regions or quadrants, and which quadrant the TRIAC operates in is dependent on the polarity of the voltage across the first main terminal (MT1) and second main terminal (MT2) with respect to MT1 and the polarity of the voltage applied between the gate terminal (G) and MT1. The sensitivity of a TRIAC varies across the four quadrants, primarily due to the differences in the internal structure of the device and the interaction of the semiconductor regions. The four quadrants are commonly labeled as Q1, Q2, Q3, and Q4, and they correspond to different combinations of voltage polarity and gate signal polarity, as follows:

Q1 (Quadrant 1, or I+V+) operation occurs when both the gate and MT2 are positive with respect to MT1. The TRIAC turns on when a sufficient gate current flows, which is injected directly from the gate to MT1, polarizing the PN junction D1 and triggering the power thyristor. The voltage across the main terminals is positive. The TRIAC remains on until the load current through it falls below the holding current, at which point it turns off. Q1 is the most sensitive quadrant, as the direct triggering and the positive gate signal reinforcing the positive voltage across the main terminals facilitate the activation of the TRIAC with a smaller gate current.

Q2 (Quadrant 2, or I−V+) operation occurs when the gate is negative and MT2 is positive with respect to MT1. In this quadrant, the triggering of the thyristor is indirect: a negative gate current is applied from MT1 to the gate, polarizing the PN junction located in the gate area (D2 in the schematic). The injection from this diode then triggers the power thyristor. Because D2 is not part of the power thyristor, this triggering is considered indirect. The TRIAC turns on when a sufficient gate current flows, and the voltage across the main terminals is positive. The TRIAC remains on until the current through it falls below the holding current, at which point it turns off. As a result, sensitivity in Q2 is lower than in Q1 due to this indirect triggering.

Q3 (Quadrant 3, or I−V−) operation is similar to Q2 in that the triggering of the thyristor is also indirect, with the gate and MT2 negative with respect to MT1. Again, the negative gate current is applied from MT1 to the gate, polarizing the PN junction in the gate area first (D2), which then triggers the power thyristor indirectly. The TRIAC turns on when a sufficient gate current flows, and the voltage across the main terminals is negative. The TRIAC remains on until the current through it falls below the holding current, at which point it turns off. As a result, sensitivity in Q3 is nearly similar to Q2 due to the same indirect triggering mechanism.

Q4 (Quadrant 4, or I+V−) operation occurs when the gate is positive and MT2 is negative with respect to MT1. The TRIAC turns on when a sufficient gate current flows, and the voltage across the main terminals is negative. The TRIAC remains on until the current through it falls below the holding current, at which point it turns off. Q4 is the least sensitive quadrant, requiring a larger gate current to trigger the TRIAC.

The TRIAC can be turned on in all four quadrants, but the sensitivity and triggering characteristics vary between them. In particular, quadrants Q2 and Q3 are most commonly used due to the convenience they offer-only a single polarity of gate current is required to manage the switch irrespective of the voltage polarity.

The sensitivity of the TRIAC is a function of the gate trigger current (IGT), which is the minimum current required at the gate of the TRIAC in order to turn it on and trigger conduction. The lower the IGT, the higher the sensitivity, while the higher the IGT, the lower the sensitivity.

During commutation, the critical rate of rise of off-state current (dI/dt_c) parameter specifies the maximum rate of change of current that the TRIAC can safely handle during turn-off.

Figure 5:
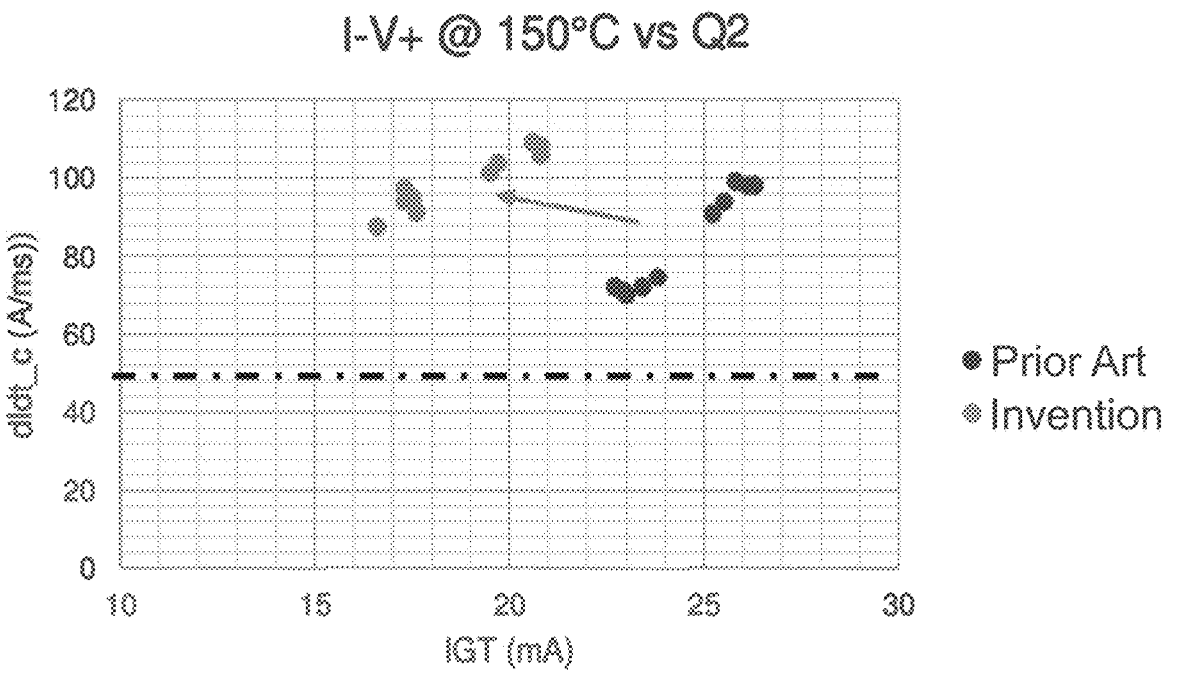
FIG. 5 is a graph showing Q2 sensitivity and commutation performance of the TRIAC design of FIG. 2 when operating in the I−V+ mode of operation.

The effect of the N+ layer N5 on sensitivity is now discussed—the addition of the N+ layer (N5) affects the gate trigger current (IGT) required for turning on the TRIAC. As shown in FIG. 5, IGT is substantially lowered in Q2, which indicates a significant increase in sensitivity. Similarly, as observed in FIG. 5, the IGT is also lowered in Q3, indicating an increase in sensitivity in that quadrant as well. This improved sensitivity means that the TRIAC can be triggered with a smaller gate current in Q2 and Q3, which is beneficial for controlling various loads efficiently.

Figure 6:
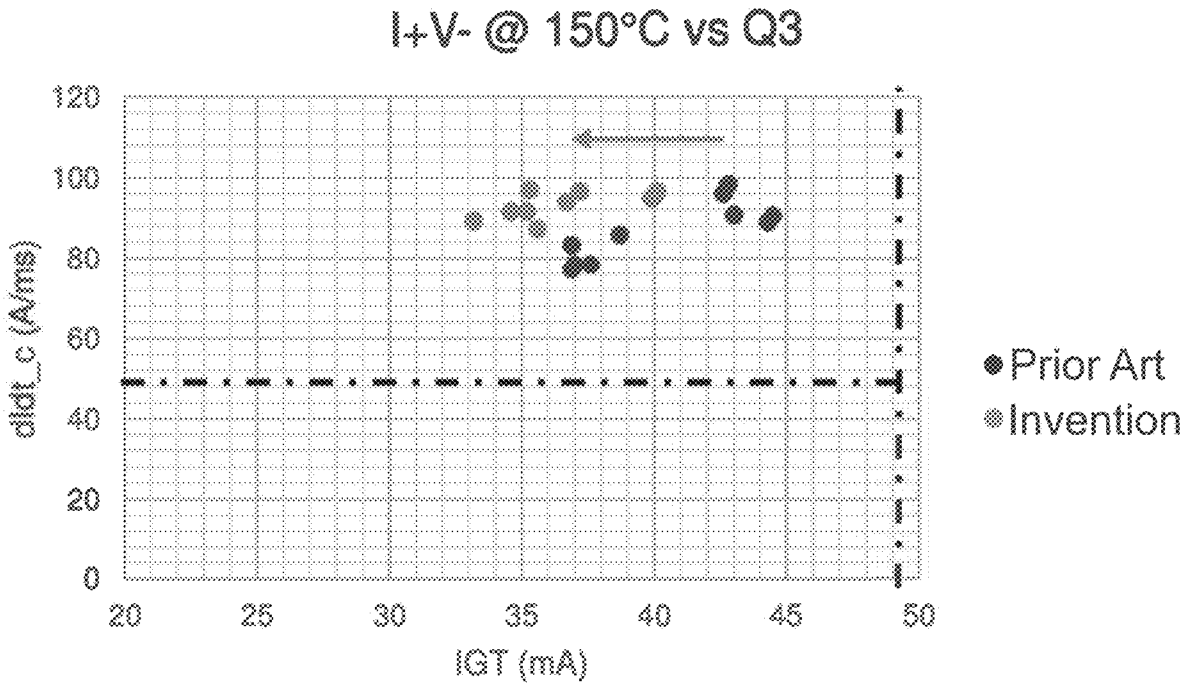
FIG. 6 is a graph showing Q3 sensitivity and commutation performance of the TRIAC design of FIG. 2 when operating in the I+V− mode of operation.

The effect of the N+ layer N5 on commutation is now discussed—the presence of the N+ layer (N5) has an effect on the critical rate of rise of off-state current (dI/dt_c) during commutation. In Q2, as shown in FIG. 5, the dI/dt_c in I−V+ operation is slightly increased, indicating a slight improvement in commutation performance. In Q3, as shown in FIG. 6, dI/dt_c in I+V− operation remains essentially the same. These results suggest that the additional N5 layer aids the TRIAC in handling the maximum rate of change of current during turn-off in I−V+ operation without compromising its performance.

The N+ layer (N5) helps balance the performance of the TRIAC across the Q2 and Q3 quadrants. While IGT increases when operating in Q1, meaning that sensitivity is lowered in Q1, this is not of concern because Q1 is already the most sensitive quadrant. By adding the N5 layer, the TRIAC becomes more versatile in controlling resistive and inductive loads across various applications, as the sensitivity and commutation performance become more consistent across the different quadrants.

Finally, it is evident that modifications and variations can be made to what has been described and illustrated herein without departing from the scope of this disclosure. While this disclosure has been described with respect to a TRIAC formed using double mesa technology, note that the underlying principles presented herein are not limited to this specific fabrication method. The TRIAC disclosed herein could also be realized using other semiconductor manufacturing technologies such as Planar technology, where flat layers of material are built up on the substrate. Similarly, the Top Glass process or other technologies employing a glass layer or coating may also be suitable for implementing the TRIAC design disclosed herein.

The TRIAC described above provides advantages in terms of high-voltage handling, making it suitable for a variety of devices and applications. These include, but are not limited to, power supply circuits, motor control systems, and light dimming circuits.

Another noteworthy application of the TRIAC is in motor starters. These devices often require robust and efficient components capable of handling high voltages, such as the 1200V capacity of the TRIAC disclosed herein. In motor starters, the TRIAC is utilized to control the supply of power, thereby enabling smooth start-up and operation of motors.

Solid State Relays (SSRs) also greatly from the implementation of the TRIAC described herein. In SSRs, the TRIAC functions as a switch, suitable controlling the flow of electricity without the use of additional mechanical components, thereby enhancing reliability and durability.

Moreover, gate opener systems can utilize this TRIAC in their control circuitry. In such systems, the TRIAC is utilized to manage the supply of power to the motor, providing for efficient and reliable operation of the gate opener mechanism.

Further, the TRIAC can be integrated into ACST (AC Switch Transistor) devices that are utilized in various appliances and industrial applications.

Figure 7:
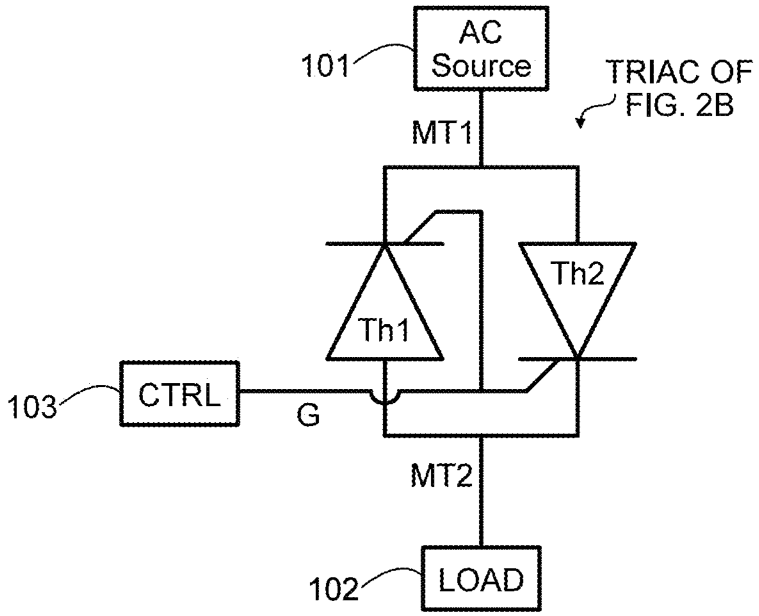
FIG. 7 is a schematic block diagram of a system utilizing the TRIAC design of FIG. 2B.

An example is shown in FIG. 7, in which the MT1 terminal of the TRIAC is connected to an AC power source 101 and the MT2 terminal of the TRIAC is connected to a load 102. The load 102 may be, for example, a motor, a motor starter, a solid-state relay, an AC Switch Transistor device, a lighting system, or other suitable load. A control circuit 103 is connected to the gate terminal G of the TRIAC and modulates the operation of the TRIAC by controlling the voltage applied to the gate terminal G. In turn, this regulates the power supply to the load 102, helping ensure that it operates within the specified parameters.

Although this disclosure has been described with a limited number of embodiments, those skilled in the art, having the benefit of this disclosure, can envision other embodiments that do not deviate from the disclosed scope. Furthermore, skilled persons can envision embodiments that represent various combinations of the embodiments disclosed herein made in various ways.

The invention claimed is:

1. A TRIAC, comprising:

first and second main terminal contacts, and a gate terminal contact; and a plurality of semiconductor regions stacked along a first axis and extending laterally along an intersecting second axis, defining a first region, a second region, and a middle region;

the plurality of semiconductor regions including:

a third N-type region overlying the second main terminal contact, extending laterally through the second region and partially through the middle region;

a second P-type region overlying the second main terminal contact, extending laterally through the first region, partially over the third N-type region in the middle region, and over the third N-type region in the second region;

a second N-type region overlying the second P-type region, extending laterally across the first region, middle region, and second region;

a first P-type region overlying the second N-type region, extending laterally across the first region, middle region, and second region, the first P-type region having a doping concentration that is greater in an upper portion than in a lower portion;

a first N-type region partially overlying the first P-type region, extending laterally partly through the first region;

a fourth N-type region partially overlying the first P-type region, extending laterally partly through the middle region; and a fifth N-type region partially overlying the first P-type region, extending laterally partly through the first region and the middle region, the fifth N-type region extending as a finger from the fourth N-type region toward the first N-type region;

wherein a portion of the first main terminal contact is disposed on the first N-type region in the first region and another portion is disposed on the first P-type region in the second region; and wherein the gate terminal contact is disposed partially on the first P-type region and the fourth N-type region in the middle region, and wherein the fifth N-type region is positioned along a current path between the gate terminal contact and the first main terminal contact such that current flowing along said path is forced to traverse beneath the fifth N-type region through the lower portion of the first P-type region.

2. The TRIAC of claim 1, wherein a first thyristor is formed in the first region and a second thyristor is formed in the second region;

wherein the first thyristor is formed by the first N-type region, the first P-type region, the second N-type region and the second P-type region;

wherein the second thyristor is formed by the third N-type region, the second P-type region, the second N-type region, and the first P-type region;

wherein the gate terminal contact is connected to the first P-type region and the fourth N-type region to control current flow between the first and second main terminal contacts by modulating operation of the first and second thyristors within the TRIAC; and wherein the fifth N-type region is positioned between the first N-type region and the fourth N-type region, serving as a serial resistance between the gate terminal contact and the first main terminal contact, improving sensitivity and commutation of the TRIAC in certain operating conditions without causing significant degradation of sensitivity of the TRIAC in other operating conditions.

3. The TRIAC of claim 2, wherein the first and second thyristors are configured to operate in first, second, third, and fourth quadrants based on polarity of a voltage applied across the first and second main terminals and the polarity of a voltage applied between the gate terminal and the first main terminal;

wherein presence of the fifth N-type region lowers a gate trigger current in the second and the third quadrant and increases a critical rate of rise of off-state current of the TRIAC when the TRIAC is operating with a negative power current, through the second thyristor, resulting in increased sensitivity and improved commutation when the TRIAC is operating in an I−V+ region.

4. A TRIAC, comprising:

a first main terminal contact, a second main terminal contact, and a gate terminal contact;

a first thyristor comprising a PNP transistor and a NPN transistor, with a base of the NPN transistor being connected to a collector of the PNP transistor and a base of the PNP transistor is connected to a collector of the NPN transistor, with an emitter-base junction of the NPN transistor having a forward-biased behavior modeled by a diode and a pinch-off resistance in parallel;

a second thyristor comprising a PNP transistor and a NPN transistor, with the base of the NPN transistor being connected to the collector of the PNP transistor and the base of the PNP transistor being connected to the collector of the NPN transistor, with a shared semiconductor region forming the collector of the NPN transistor and the base of the PNP transistor;

wherein a shared semiconductor region forms the collector of the NPN transistor and the base of the PNP transistor;

wherein the gate terminal contact is connected to the base of the NPN transistor which is involved in the first thyristor, allowing control of current flow between the first and second main terminal contacts by modulating operation of the NPN and PNP transistors; and a serial resistance between the gate terminal contact and the first main terminal contact, thereby improving sensitivity and commutation of the TRIAC in certain operating conditions without causing significant degradation of sensitivity in other operating conditions, wherein the serial resistance is formed by a doped region positioned along a current path between the gate terminal contact and the first main terminal contact, the doped region overlying a semiconductor layer having an upper portion with a first doping concentration and a lower portion with a second doping concentration less than the first doping concentration, such that current flowing along said current path is forced to traverse beneath the doped region through the lower portion of the semiconductor layer.

5. A TRIAC according to claim 4, wherein the first thyristor is formed in a first semiconductor region, the second thyristor is formed in a second semiconductor region, and the shared semiconductor region is formed in a third semiconductor region that is located between the first and second semiconductor regions.

6. A TRIAC according to claim 5, wherein the first thyristor is a two-lead thyristor, the second thyristor is a two-lead thyristor, and the shared semiconductor region is a common base region of the first and second thyristors.

7. A system for controlling AC power, the system comprising:

the TRIAC of claim 4, having its first main terminal contact connected to an AC power source and its second main terminal contact connected to a load; and a control circuit coupled to the gate terminal contact of the TRIAC, configured to modulate operation of the TRIAC and control power delivery from the AC power source to the load based on a set of operating conditions of the load.

8. The system of claim 7, wherein the load comprises at least one of a motor, a motor starter, a solid state relay, an AC Switch Transistor device, or a lighting system.

9. A TRIAC, comprising:

a first layer doped with a first conductivity type, the first layer having an upper portion with a first doping concentration and a lower portion with a second doping concentration, the first doping concentration being greater than the second doping concentration;

a first region doped with a second conductivity type at a surface of the first layer;

the first region forming a cathode of a first thyristor of the TRIAC and the first layer forming a gate of the first thyristor;

a cathode metal layer in contact with the first region;

a second region doped with the second conductivity type at the surface of the first layer;

a gate metal layer in contact with the second region and in contact with the surface of the first layer; and a third region doped with the second conductivity type and extending from the second region in a position between the first region and where the gate metal layer contacts the surface of the first layer, wherein the third region is positioned such that current flowing between the gate metal layer and the cathode metal layer is forced to traverse beneath the third region through the lower portion of the first layer.

10. The TRIAC of claim 9, wherein a doping level of the third region with the second conductivity type is equal to a doping level of the second region with the second conductivity type.

11. A TRIAC, comprising:

a semiconductor substrate;

a second P-type region formed in the semiconductor substrate;

a third N-type region formed in the semiconductor substrate, adjacent to the second P-type region;

a second N-type region formed in the semiconductor substrate on the second P-type region;

a first P-type region formed in the semiconductor substrate on the second N-type region;

a first N-type region formed in the semiconductor substrate, adjacent to the first P-type region;

a fourth N-type region formed in the semiconductor substrate, adjacent to the first P-type region at a same level as the first N-type region and spaced apart therefrom;

a fifth N-type region formed in the semiconductor substrate, adjacent to the first P-type region at a same level as the first and fourth N-type regions and positioned therebetween but spaced apart therefrom;

a first main terminal contact having a first portion disposed on the first N-type region and a second portion disposed on the first P-type region;

a second main terminal contact disposed on the second P-type region and the third N-type region; and a gate terminal contact disposed partially on the first P-type region and partially on the fourth N-type region;

wherein the first and third N-type regions have a first doping level, wherein the first and second P-type regions have a second doping level, wherein the second and fourth N-type regions have a third doping level, wherein the fifth N-type region has a fourth doping level, and wherein the first doping level is greater than the second doping level and equal to the third and fourth doping levels.

12. The TRIAC of claim 11, wherein the fifth N-type region is formed as a finger extending from the fourth N-type region.

* * * * *